(12) United States Patent
Earle et al.

(10) Patent No.: US 7,830,164 B2
(45) Date of Patent: Nov. 9, 2010

(54) DUCTED TEST SOCKET

(75) Inventors: Terry R. Earle, Kenneth City, FL (US); Timothy Pursel, Land O Lakes, FL (US); Lance LeRoy Sundstrom, Pinellas Park, FL (US)

(73) Assignee: Honeywell International Inc., Morristown, NJ (US)

( * ) Notice: Subject to any disclaimer, the term of this patent is extended or adjusted under 35 U.S.C. 154(b) by 274 days.

(21) Appl. No.: 12/107,404

(22) Filed: Apr. 22, 2008

(65) Prior Publication Data
US 2009/0261852 A1    Oct. 22, 2009

(51) Int. Cl.
G01R 31/02    (2006.01)
(52) U.S. Cl. ........................ 324/760; 324/755
(58) Field of Classification Search ................ None
See application file for complete search history.

(56) References Cited

U.S. PATENT DOCUMENTS

| | | | |
|---|---|---|---|
| 5,172,049 A | 12/1992 | Kiyokawa et al. | |
| 5,205,132 A | 4/1993 | Fu | |
| 5,359,285 A | 10/1994 | Hashinaga et al. | |
| 5,923,179 A | 7/1999 | Taylor | |
| 6,091,062 A | 7/2000 | Pfahnl et al. | |
| 6,353,329 B1 | 3/2002 | Kiffe | |
| 6,357,023 B1 | 3/2002 | Co et al. | |
| 6,377,064 B1 | 4/2002 | Kurosu et al. | |
| 6,498,899 B2 | 12/2002 | Malinoski et al. | |
| 6,556,032 B2 | 4/2003 | Uher et al. | |
| 6,580,283 B1 | 6/2003 | Carbone et al. | |
| 6,842,030 B2 | 1/2005 | Kim et al. | |
| 6,862,405 B2 | 3/2005 | Malinoski et al. | |
| 7,084,655 B2 | 8/2006 | Min et al. | |
| 7,101,209 B2 * | 9/2006 | Yates et al. | 439/331 |
| 2002/0011863 A1 | 1/2002 | Takahashi et al. | |

OTHER PUBLICATIONS

Enplas Socket Catalogue, downloaded from http://www:enplas.co.jp/english/business/espc/index.html on Jun. 22, 2010, pp. 1-5, 7-9, 11-20, 43-45, 23-45, 47-66.
Enplas Test Sockets, downloaded from http://www.enplas.co.jp/english/business/espc/test_burnin/index.html on Jun. 22, 2010, 1 page.
Thermonics Product Overview, downloaded from http://www.thermonics.com/products/index.html on Jun. 22, 2010, 1 page.
Thermonics Temperature Forcing Systems, downloaded from http://www:thermonics.com/products/forcing.html on Jun. 22, 2010, 1 page.
Thermonics Custom Thermal Fixtures, downloaded from http://www.thermonics.com/products/thermal.html on Jun. 22, 2010, 1 page.

(Continued)

Primary Examiner—Minh N Tang
(74) Attorney, Agent, or Firm—Shumaker & Sieffert, P.A.

(57) ABSTRACT

A ducted test socket for thermally testing a device under test (DUT) is provided that can accommodate a large DUT and will improve the thermal transfer efficiency between a precision temperature forcing system (PTFS) and the DUT. The ducted test socket comprises a carrier and a base with opposing, mated cavities and holes. These cavities and holes channel airflow around the entire DUT body and out outlet ports.

20 Claims, 6 Drawing Sheets

OTHER PUBLICATIONS

Thermonics Custom Thermal Fixtures, downloaded from http://www.thermonics.com/products/thermal.html on Jun. 22, 2010, 2 pages.
Thermonics Accessory Products, downloaded from http://www.thermonicc.com/products/accessories.html on Jun. 22, 2010, 1 page.
Thermonics Accessories, downloaded from http://www.thermonics.com/products/accessories.html on Jun. 22, 2010, 2 pages.
Thermonics T-2500BE PTFS, downloaded from http://www.thermonics.com/products/t25be.html on Jun. 22, 2010, 1 page.
Thermonics T-2500E PTFS, downloaded from http://www.thermonics.com/products/t25e.html on Jun. 22, 2010, 1 page.
Thermonics T-2500E/300 PTFS, downloaded from http://www.thermonics.com/products/t25e_300.html on Jun. 22, 2010, 1 page.
Thermonics T-2500EA PTFS, downloaded from http://www.thermonics.com/products/t25ea.html on Jun. 22, 2010, 1 page.
Thermonics T-2500HFB PTFS, downloaded from http://www.thermonics.com/products/t25hfb.html on Jun. 22, 2010, 1 page.
Thermonics T-2500HFE PTFS, downloaded from http://www.thermonics.com/products/t25hfe.html on Jun. 22, 2010, 1 page.
Thermonics T-25001X PTFS, downloaded from http://www.thermonics.com/products/t-ix.html on Jun. 22, 2010, 1 page.
Thermonics T-2500SE PTFS, downloaded from http://www.thermonics.com/products/t25se.html on Jun. 22, 2010, 1 page.
Thermonics T-2500SEA PTFS, downloaded from http://www.thermonics.com/products/t25sea.html on Jun. 22, 2010, 1 page.
Thermonics T-2600BV PTFS, downloaded from http://www.thermonics.com/products/t2600.html on Jun. 22, 2010, 1 page.
Thermonics T-2610BV PTFS, downloaded from http://www.thermonics.com/products/t2610.html on Jun. 22, 2010, 1 page.
Thermonics T-2650BV PTFS, downloaded from http.//www.thermonics.com/products/t2650.html on Jun. 22, 2010, 1 page.
Thermonics T-2800 PTFS, downloaded from http://www.thermonics.com/products/t2800.html on Jun. 22, 2010, 1 page.
Thermonics T-2820 PTFS, downloaded from http://www.thermonics.com/products/t2820.html on Jun. 22, 2010, 1 page.
Thermonics T-2820SX PTFS, downloaded from http://www.thermonics.com/products/t2820sx.html on Jun. 22, 2010, 1 page.
T-2500 PTFS downloaded from http://www.thermonics.com/products/t25details.html on Jun. 23, 2010, 4 pages.

* cited by examiner

DUCTED TEST SOCKET

GOVERNMENT RIGHTS

This invention was made with Government support under Prime Contract Number N00030-05-C-0007 awarded by the United States Navy. The Government may have certain rights in this invention.

FIELD

The present invention relates generally to thermal testing of a device under test. More particularly, the present invention relates to a test socket used with a precision temperature forcing system.

BACKGROUND

Precision temperature forcing systems (PTFS) provide a low-cost means to thermally test a device under test (DUT). The thermal head of a PTFS is designed for coplanar positioning of the bottom edges of its thermal cap and glass shroud. This usually involves sealing the thermal cap and shroud directly to the host printed board (PB) of the DUT.

A thermal cap attached to the air flow nozzle of the PTFS thermal head directs temperature controlled air directly onto the DUT and then out through its vent holes into the shroud area and eventually out the vent holes of the thermal head. The thermal cap is intended to minimize the air volume directly around the DUT and reduce the air flow rate necessary to force the target temperatures.

However, standard conductive or nonconductive rubber thermal caps can only accommodate a limited range of component sizes. When a DUT or its test socket is too large for a standard thermal cap and the thermal cap cannot be retracted far enough to accommodate the height of the DUT or its test socket, the thermal cap can be omitted. However, once the thermal cap is omitted the entire shroud air volume must be forced to the target temperatures. The extra thermal load slows down temperature transition times and also requires higher air flow rates which can cause condensation and icing issues at extended cold temperatures.

In an attempt to solve this problem, the PB area around the large socket is built up with a suitable material, such as conductive or nonconductive silicone foam rubber, to raise the shroud footprint up to the top of the test socket so that a thermal cap can be sealed against the top of the DUT or its test socket. With this configuration, very little of the forced air reaches the exposed area of the DUT. The rest of the forced air is deflected off the component carrier of the test socket or flows directly out the thermal cap vents without ever reaching the DUT. In addition, only a small portion of the DUT body surface is exposed to the forced air. The rest is insulated by the component carrier and contact base of the test socket. This results in a rather poor thermal transfer between the forced air and the DUT.

SUMMARY

In accordance with the present invention, a ducted test socket for testing a device under test (DUT) is provided. This new and improved test socket can accommodate a large DUT and will improve the airflow through the thermal head to the DUT and out to the shroud.

The ducted test socket comprises a carrier and a base. The carrier and base have opposing cavities that mate to form a DUT body cavity. The DUT body cavity is sized to provide enough clearance around the top, sides and bottom of the DUT body to support sufficient airflow around the DUT body. Four corner outlet ports through both the carrier and the base allow air to flow through both opposing cavities. Channels in the base exhaust air from the carrier/base DUT cavity out to the four corner outlet ports and up into the shroud area. A center hole is located in the middle of both opposing cavities. In addition, a hole may be present in the printed board (PB). The base and PB holes provide access to the DUT die for probing or radiation (e.g. heavy ion & proton) testing. The PB hole may be plugged for thermal testing.

The thermal cap can be replaced with a short piece of hose without vent holes, and the buildup of conductive or nonconductive silicone foam rubber around the test socket can be eliminated. The shroud seals directly to the host PB. The PB area needed to form the bottom walls of the channels is minimized to limit PB thermal transfer.

All air flows down through the air nozzle and hose extension directly into the ducted test socket, where it is channeled around the entire DUT body surface and out four corner outlet ports up into the shroud area. Unlike a standard test socket that interferes with DUT airflow, this ducted test socket greatly enhances DUT airflow. The test socket also insulates the DUT from surrounding air, reducing the thermal load. All of this greatly increases the thermal transfer rate between the forced air and the DUT, resulting in faster temperature transition times and lower air flow rates that reduce the probability of condensation and icing at extended low temperatures. Additional advantages are improved reliability and reduction of cost and schedule associated with DUT temperature testing.

A variety of air flow ducts could be integrated into a variety of test socket types to simplify the PTFS interface and greatly increase the thermal transfer between its forced air and the DUT.

BRIEF DESCRIPTION OF THE DRAWINGS

Various embodiments are described herein with reference to the following drawings. Certain aspects of the drawings are depicted in a simplified way for reason of clarity. Not all alternatives and options are shown in the drawings and, therefore, the invention is not limited in scope to the content of the drawings. In the drawings.

DETAILED DESCRIPTION

Figure 1:
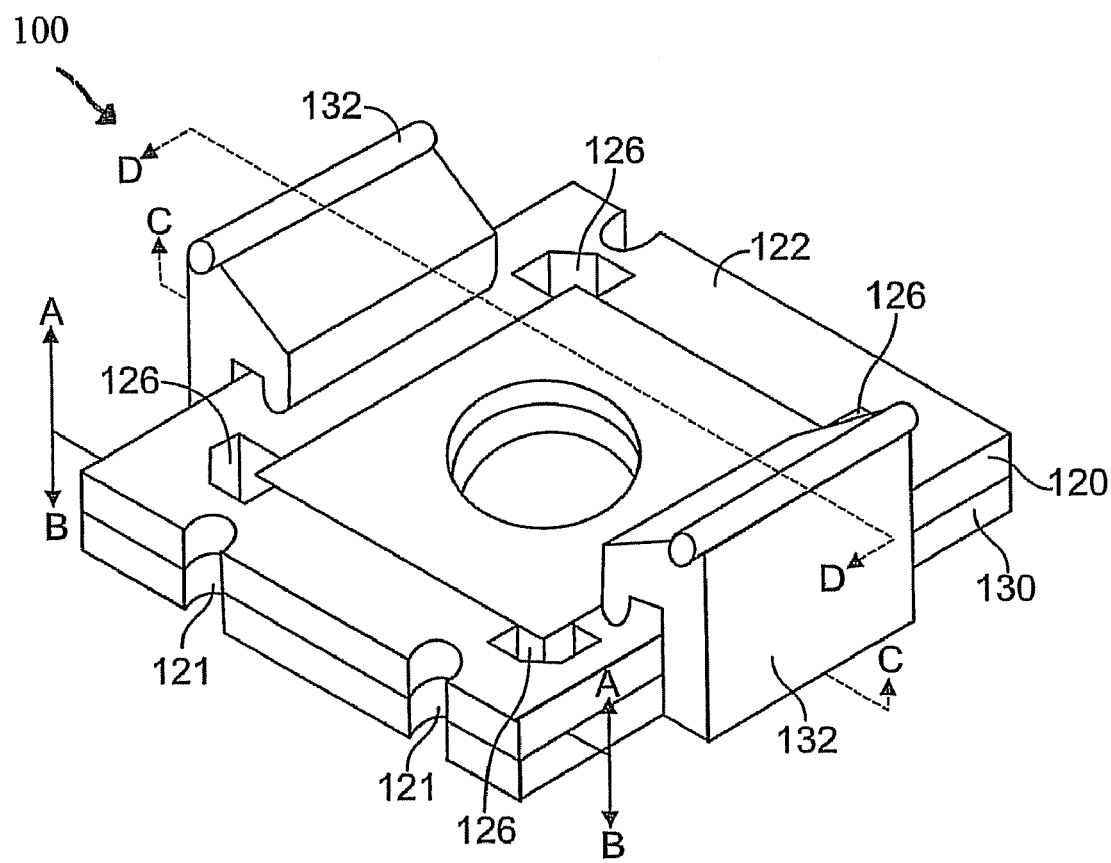
FIG. 1 is a perspective view of a ducted test socket according to one embodiment of the present invention.

FIG. 1 depicts a perspective view of a ducted test socket 100 according to one embodiment of the present invention.

Ducted test socket 100 allows for the testing of a device 110 (not shown). Device 110 may be an integrated circuit. Specifically, device 110 may be a quad flat package (QFP). A QFP is an integrated circuit package with leads extending from each of four sides. Although a QFP typically comprises a flat rectangular or square body with leads on four sides, a multiplicity of designs may exist. For example, device 110 may be a bumpered QFP, which has an array of leads extending from the four sides of the package, and extensions at the four corners to protect the leads against mechanical damages before the unit is soldered. However, ducted test socket 100 may accommodate a number of other terminals.

Ducted test socket 100 comprises a carrier 120 and a base 130. Base 130 includes a plurality of clamps 132 that rotate to attach the top surface 122 of carrier 120 to the base 130, as shown in FIG. 1. Cavities (not shown) in carrier 120 and base 130 are sized to provide enough clearance around the top, sides and bottom of device 110 to support sufficient airflow around the device. Carrier 120 and base 130 may be made from molded plastic. Alternatively, carrier 120 and base 130 may be made from a variety of other materials suitable to withstand thermal or radiation testing. Carrier 120 and base 130 also include alignment post/notch features 121 to provide carrier to base alignment and keying. The alignment post/notch features 121 prevent reverse carrier-base mating. Base alignment posts mate with carrier alignment notches.

Figure 2:
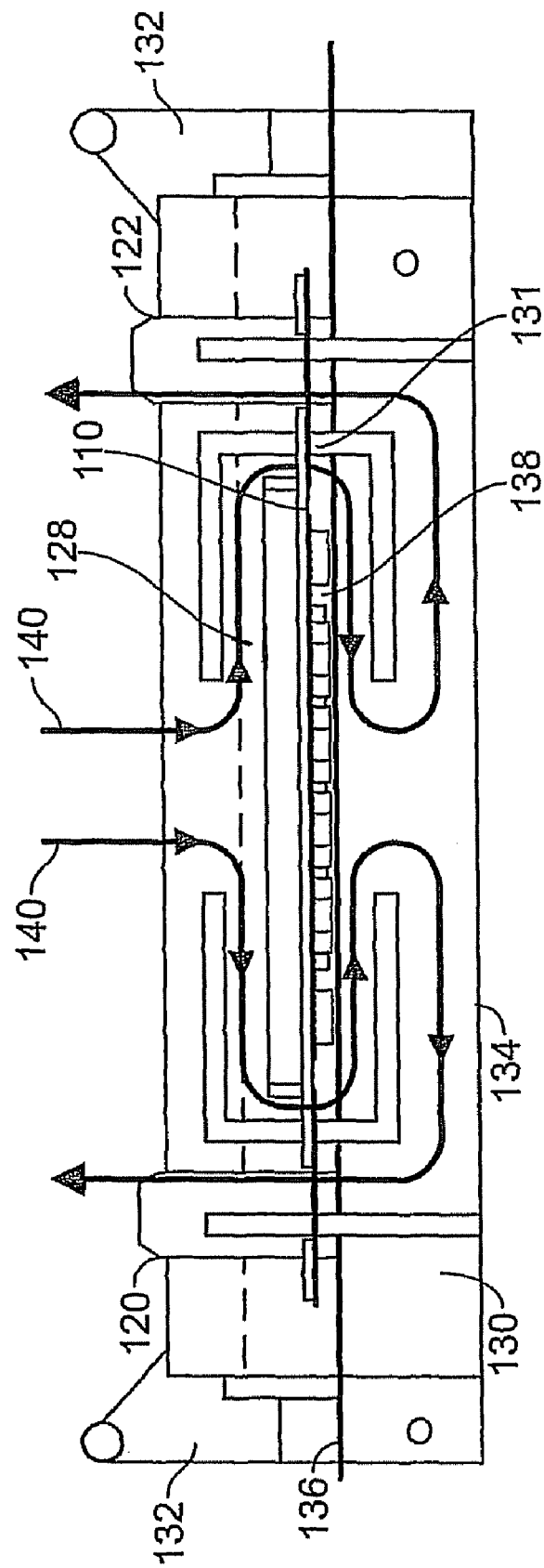
FIG. 2 is a vertical cross-sectional D-D view of a ducted test socket of FIG. 1.

FIG. 2 is a vertical cross-sectional D-D view of ducted test socket 100 from FIG. 1. In FIG. 2, the cross-sectional D-D view illustrates the component parts, including the implanted device 110, as well as an airflow path 140 through the test socket. Base 130 is joined to carrier 120 with latches 132. Carrier 120 comprises a carrier DUT body cavity 128, a lead comb and a retainer clip (not shown) to retain device 110 for testing. The nonconductive lead combs align the leads of the device 110 and the retainer clip holds the device 110 within the carrier. The lead combs can be integral to carrier 120 or may be part of a molded insert. The Enplas test socket, for example, has a nonconductive molded plastic lead comb insert.

Figure 5:
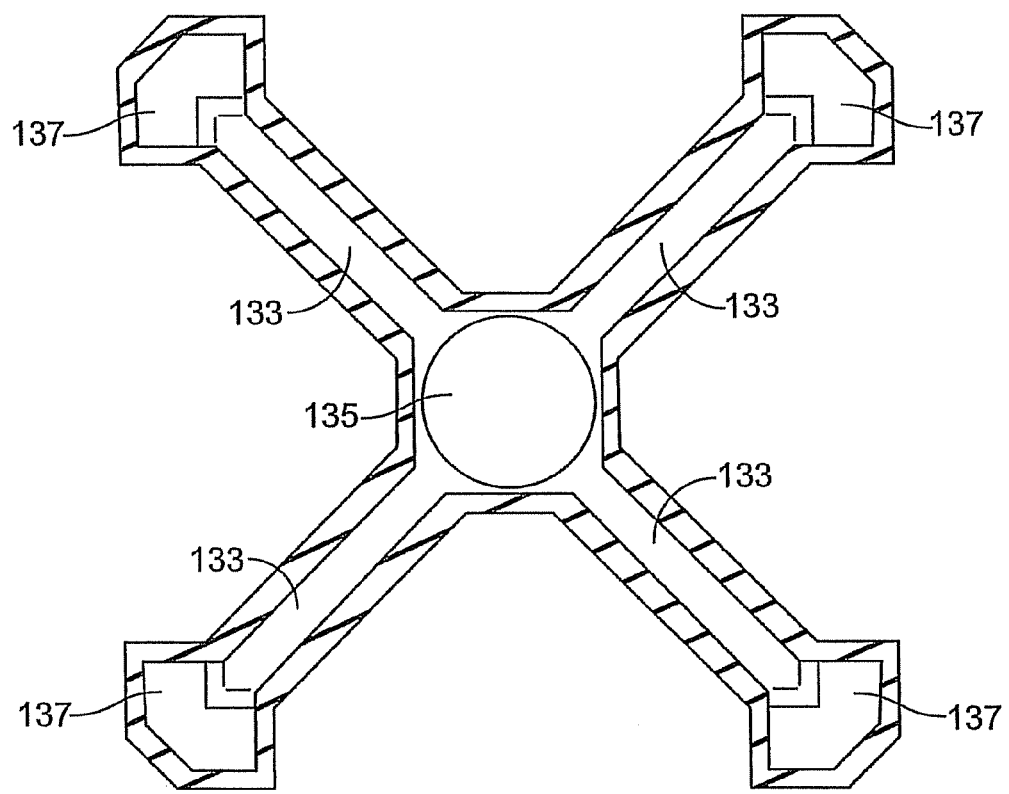
FIG. 5 is a horizontal C-C bottom view of the ducted test socket of FIG. 1 with only the base bottom exhaust air channels shown.

Base 130 is composed of a base bottom 134 and a base top 136, and comprises a base DUT body cavity 138 and lead contacts (not shown) for device 110 testing. Base 130 also includes the plurality of clamps 132 for securing carrier 120 to base 130. A raised section 131 on base top 136 defines the edges of base DUT body cavity 138, providing a confined area within which the body of device 110 is positioned. Base bottom 134 includes a plurality of channel cavities 133, shown in the C-C base bottom view of FIG. 5. FIG. 5 shows that each channel cavity 133 originates from a base hole 135, and terminates at a base outlet port of the plurality of base outlet ports 137. The plurality of base outlet ports 137 extend through the entire depth of base 130. Base hole 135 extends through the entire depth of base 130.

Figure 3:
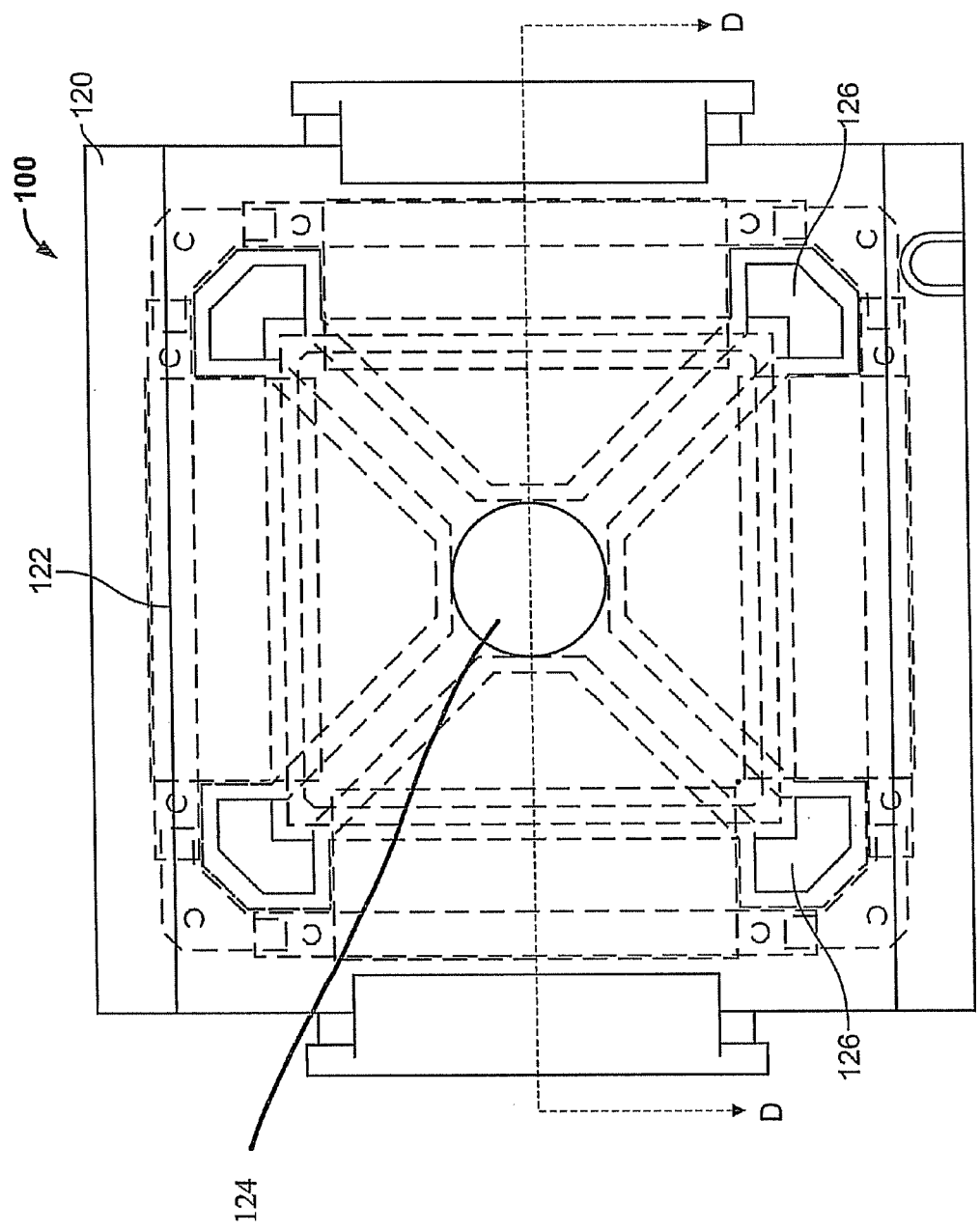
FIG. 3 is a top view of the ducted test socket of FIG. 1 with the DUT body cavity and bottom exhaust channels shown as hidden lines.

FIG. 3 shows a top view of ducted test socket 100. Carrier 120 includes a plurality of carrier outlet ports 126 that extend through the entire depth of carrier 120. Plurality of base outlet ports 137 are located on base 130 such that when base 130 is properly aligned and mated with carrier 120, plurality of carrier outlet ports 126 are aligned with plurality of base outlet ports 137, allowing air to flow through both holes. Carrier 120 includes a carrier hole 124 that cuts through the entire depth of carrier 120. As shown in FIG. 4, base hole 135 is located on base 130 such that when base 130 is properly aligned and mated with carrier 120, a carrier hole 124 is aligned with base hole 135, allowing air to flow through both holes.

Figure 4B:
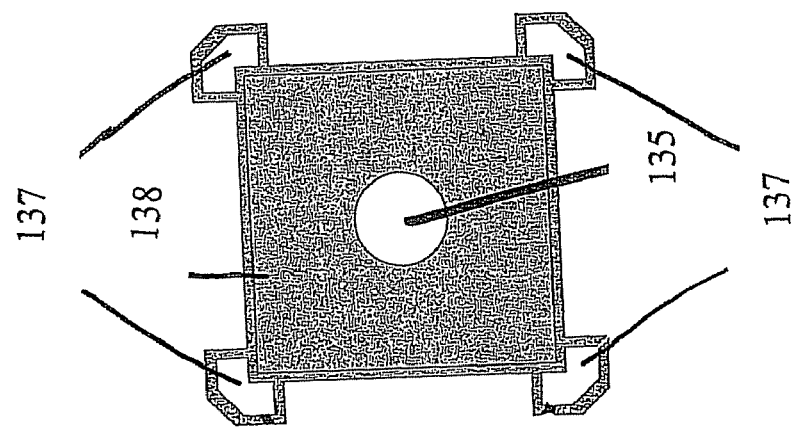
FIG. 4b is a horizontal B-B base top view of the test socket of FIG. 1 with only the DUT body cavity and exhaust ports shown.
Figure 4A:
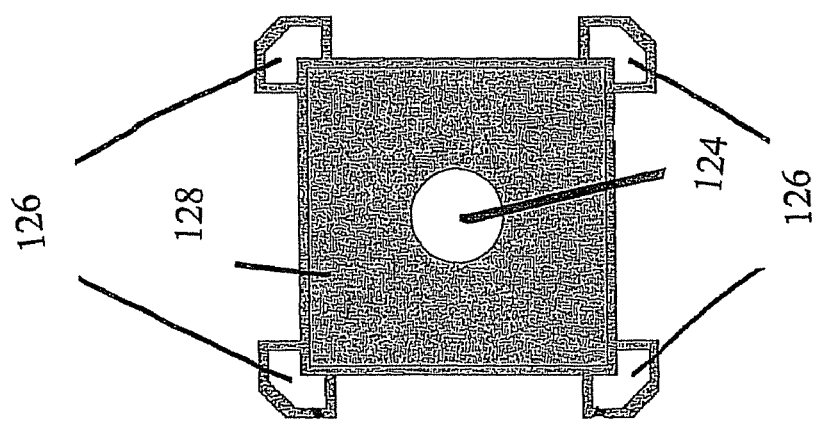
FIG. 4a is a horizontal A-A carrier bottom view of the test socket of FIG. 1 with only the device under test (DUT) body cavity and exhaust ports shown.

FIG. 4a is a horizontal A-A carrier bottom view of the test socket of FIG. 1 with only the carrier DUT body cavity 128 and plurality of carrier outlet ports 126 shown.

FIG. 4b is a horizontal B-B base top view of the test socket of FIG. 1 with only the base DUT body cavity 138 and plurality of base outlet ports 137 shown.

FIG. 2 shows the path of the airflow 140 through ducted test socket 100. The airflow enters carrier hole 124, flows around body of device 110, and into base hole 135. Base 130 channels the air that flows downward from carrier 120 through base hole 135, the plurality of channel cavities 133, and out to each of the plurality of base outlet ports 137 and plurality of carrier outlet ports 126.

To assemble device 110 within base 130 and carrier 120 as shown in FIG. 2, device 110 is first mounted "dead bug," or die cavity side down, into carrier 120. The leads of device 110 nest into the molded combs, not shown, of carrier 120 and device 110 is held in place with a snap-in retention clip, also not shown.

Figure 6:
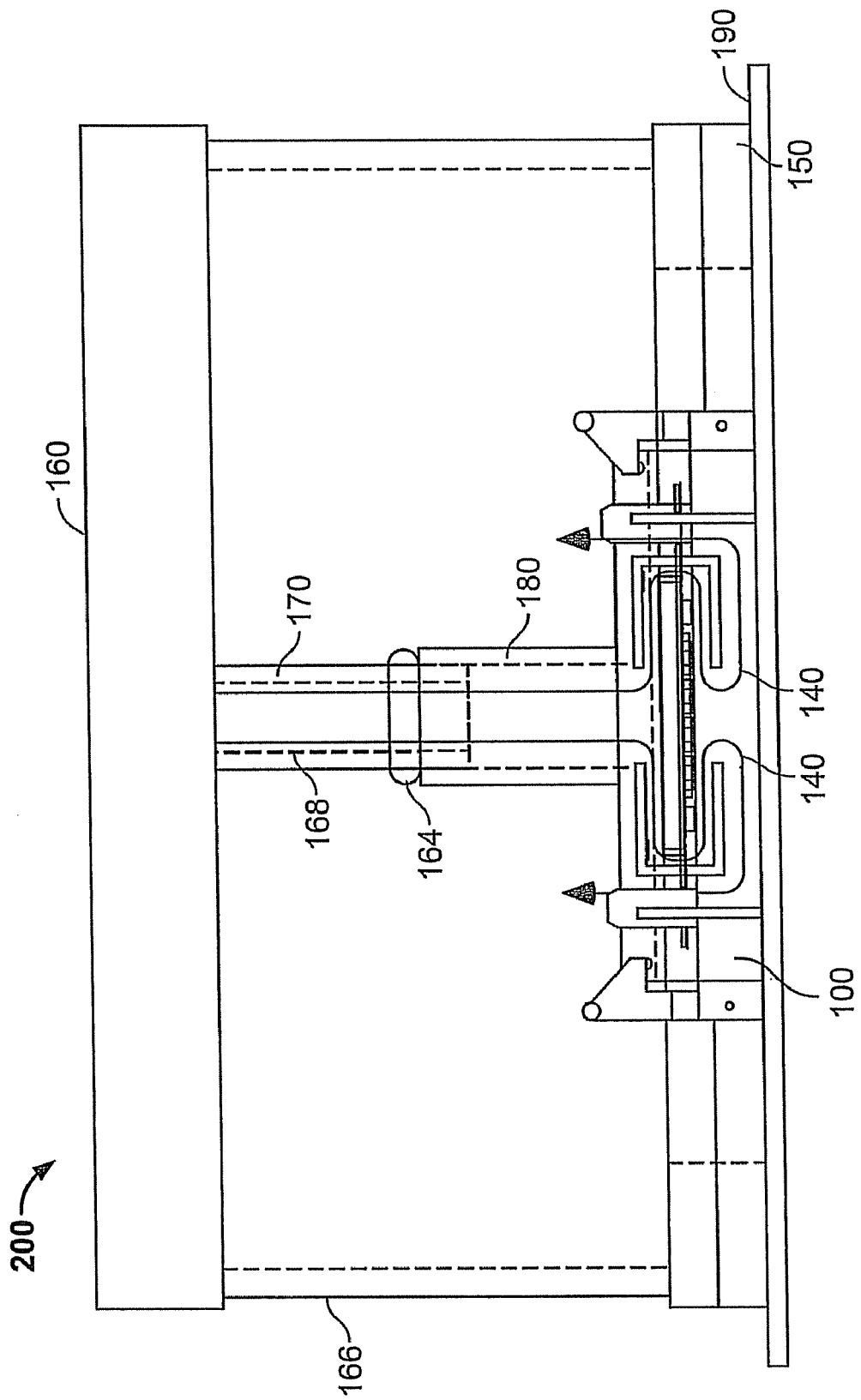
FIG. 6 depicts a vertical cross-sectional view of a precision temperature forcing system (PTFS) thermal head with the ducted test socket of FIG. 1 mounted to a host printed board in the operating position.

FIG. 6 depicts the thermal head 200 of a precision temperature forcing system (PTFS) with the ducted test socket of FIG. 1 in the operating position. Ducted test socket 100 is to be used with a PTFS. The PTFS may be a Thermonics T-2500E. A PTFS provides a low-cost means of thermally testing device 110 because only device 110 is forced to the target temperatures, allowing for low-cost commercial components and cables to be used.

The PTFS thermal head 200 comprises a thermal head 160, an air nozzle 170 with a hilt 164 and a shroud glass wall 166 and base 150, as shown in FIG. 6. Thermal head 200 is designed for coplanar positioning of the bottom edges of a hose extension 180 and a shroud base 150. Air nozzle 170 is spring-loaded and retractable.

Hose extension 180 is pushed onto air nozzle 170 up to its hilt 164. Hose extension 180 is pressed against top surface 122 of carrier 120. Hose extension 180 may be pressure sealed onto top surface 122. Thermal cap 164 and hose extension 180 are intended to minimize the air volume directly around device 110 and reduce the air flow rate necessary to force the target temperatures.

After device 110 is secured to carrier 120, carrier 120 is mated to base 130. Base 130 is attached to a host printed board 190. Base 130 may be attached to printed board 190 using a variety of attachment means. Printed board 190 may also comprise a hole that corresponds to base hole 135 and carrier hole 124. The hole in printed board 190 may be plugged up with a suitable plug to seal the ambient air from device 110. The desire to seal ambient air from device 110 is to avoid moisture contacting device 110, and to ensure proper airflow through the test socket. However, the hole in printed board 190 may be left open for uses such as die probing and radiation testing, where a clear line of sight path to the device 110 die is needed. Plurality of clamps 132 of base 130 rotate and latch onto top surface 122 of carrier 120, securing carrier 120 to base 130.

In operation, after device 110 has been secured in carrier 120 and to base 130 which is attached to host printed board 190, PTFS thermal head 200 with hose extension 180 is aligned and lowered over ducted test socket 100. In this position, the spring-loaded air nozzle 170 with hose extension 180 is sealed to the top of ducted test socket 100 and the shroud base 150 is sealed to the host PB 190. Hose extension may be made from a variety of pliable materials. Forced air flows down through the air nozzle 170 and hose extension 180 of PTFS thermal head 200 directly onto ducted test socket 100. As previously described, the forced air flows through carrier hole 124, is channeled around the entire body surface of device 100, and through base hole 135. From base hole 135, the airflow may flow either through a hole in the printed board or into the plurality of channel cavities 133. The air that flows into each of the plurality of channel cavities 133 is then channeled into its corresponding base outlet hole of the plurality of base outlet ports 137, then through its corresponding carrier outlet hole of the plurality of carrier outlet ports 126. When the air exits the plurality of carrier outlet ports 126, the air is then released into the shroud area. This airflow path is depicted with the arrows 140.

Unlike a standard test socket that interferes with DUT airflow, ducted test socket 100 greatly enhances airflow around device 100 thanks to its air duct system.

Ducted test socket 100 also insulates device 110 from the surrounding air, reducing the thermal load. This greatly increases the thermal transfer rate between the forced air and device 110, resulting in faster temperature transition times and lower air flow rates that reduce the probability of condensation and icing at extended low temperatures. Additional advantages are improved reliability and reduction of cost and schedule associated with device 110 temperature testing.

Variations and modifications of the present invention will be obvious to those skilled in the art and it is intended to cover in the appended claims all such modifications and equivalents. The entire disclosures of all references, applications, patents, and publications cited above, are hereby incorporated by reference.

We claim:

1. A test socket for a device, the test socket comprising:
   a carrier having a generally flat top surface, a first plurality of upstanding walls extending from the top surface to a carrier bottom edge to define a first interior cavity below the top surface; and
   a base, wherein the base comprises a generally flat middle surface, a second plurality of upstanding walls extending from the middle surface to a base top edge of the base to define a second interior cavity, a first hole extending both above and below the middle surface, a plurality of channels that lie below the middle surface, and a first plurality of outlet ports,
   wherein each of the plurality of channels extends from the first hole to one of the first plurality of outlet ports.

2. The test socket of claim 1, wherein the carrier further comprises a second hole extending from the top surface through the first interior cavity, and a second plurality of outlet ports that extend from the top surface through the carrier bottom edge.

3. The test socket of claim 2, wherein the carrier bottom edge and the base top edge mate so that the first hole and the second hole are aligned and the first and second plurality of outlet ports are aligned.

4. The test socket of claim 3, wherein the base comprises a plurality of clamps that mechanically attach to the carrier top surface to secure the carrier to the base.

5. The test socket of claim 3, wherein the first and second interior cavities, the first and second holes, the plurality of channels, and the first and second plurality of outlet ports are in fluid communication.

6. The test socket of claim 1, wherein the device is implanted within the first and second interior cavities.

7. The test socket of claim 1, wherein the test socket is used for thermally testing the device.

8. The test socket of claim 1, wherein the test socket is used for radiation testing.

9. A method of testing a device, the method comprising:
   implanting the device within a first interior cavity of a carrier;
   mating the carrier to a base, wherein the device rests within the first interior cavity and a second interior cavity, wherein the second interior cavity is located within the base;
   forcing air through a thermal head into a first hole extending through the carrier and a second hole extending through the base;
   channeling the air from the second hole through a plurality of channels; and
   forcing the air to exit the plurality of channels via a plurality of outlet ports.

10. The method of claim 9, further comprising the step of:
    securing the carrier to the base using a plurality of clamps.

11. The method of claim 9, wherein the forced air originates from a precision temperature forcing system.

12. The method of claim 11, wherein a hose extension is attached to an air nozzle of the precision temperature forcing system, the hose extension being pressure sealed to the carrier to deliver the forced air to into the first hole extending through the carrier.

13. A test socket for a device, the test socket comprising:
    a carrier having a first cavity formed by a generally flat first surface and a first plurality of upstanding walls extending from the first surface to a first edge; and
    a base, wherein the base comprises a second plurality of upstanding walls extending from a second edge to a third edge, a generally flat second surface that lies between the second edge and the third edge, a first hole extending from the second surface to the third edge, and a plurality of channels that lie between the second surface and the third edge and that extend from the first hole to a first plurality of outlet ports.

14. The test socket of claim 13, wherein the carrier further comprises a second hole extending from the first surface through the first cavity, and a second plurality of outlet ports that extend from the first surface through the first edge.

15. The test socket of claim 14, wherein the first edge and the second edge mate so that the first hole and the second hole are aligned and the first and second plurality of outlet ports are aligned.

16. The test socket of claim 15, wherein the base comprises a plurality of clamps that mechanically attach to the first surface to secure the carrier to the base.

17. The test socket of claim 15, wherein the first and second holes, the plurality of channels, and the first and second plurality of outlet ports are in fluid communication.

18. The test socket of claim 13, wherein the test socket is used for radiation testing.

19. The test socket of claim 13, wherein the test socket is used for thermally testing the device.

20. The test socket of claim 13, wherein the test socket is used for probe testing.

* * * * *

UNITED STATES PATENT AND TRADEMARK OFFICE
CERTIFICATE OF CORRECTION

| | | |
|---|---|---|
| PATENT NO. | : 7,830,164 B2 | Page 1 of 1 |
| APPLICATION NO. | : 12/107404 | |
| DATED | : November 9, 2010 | |
| INVENTOR(S) | : Earle et al. | |

It is certified that error appears in the above-identified patent and that said Letters Patent is hereby corrected as shown below:

Column 6, line 29 (Claim 12), "deliver the forced air to into" should be -- deliver the forced air into --

Signed and Sealed this
Twenty-sixth Day of June, 2012

David J. Kappos
*Director of the United States Patent and Trademark Office*